US010580906B1

(12) United States Patent
Dinh et al.

(10) Patent No.: US 10,580,906 B1
(45) Date of Patent: Mar. 3, 2020

(54) SEMICONDUCTOR DEVICE COMPRISING A PN JUNCTION DIODE

(71) Applicant: NXP B.V., Eindhoven (NL)

(72) Inventors: Viet Thanh Dinh, Leuven (BE); Marina Vroubel, Nijmegen (NL); Paul Alexander Grudowski, Austin, TX (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/148,285

(22) Filed: Oct. 1, 2018

(51) Int. Cl.
*H01L 29/861* (2006.01)
*H01L 29/417* (2006.01)
*H01L 27/02* (2006.01)
*H01L 29/66* (2006.01)
*H01L 29/40* (2006.01)
*H01L 29/06* (2006.01)

(52) U.S. Cl.
CPC ........ *H01L 29/861* (2013.01); *H01L 27/0255* (2013.01); *H01L 29/0649* (2013.01); *H01L 29/0688* (2013.01); *H01L 29/402* (2013.01); *H01L 29/417* (2013.01); *H01L 29/66136* (2013.01)

(58) Field of Classification Search
CPC ............... H01L 29/861; H01L 27/0255; H01L 29/0649; H01L 29/0688; H01L 29/402; H01L 29/66136
See application file for complete search history.

(56) References Cited

U.S. PATENT DOCUMENTS

| 5,982,015 A * | 11/1999 | Hirayama | H01L 29/0692 257/476 |
| 9,240,468 B2 | 1/2016 | Vanhoucke et al. | |
| 9,570,546 B2 | 2/2017 | Vanhoucke et al. | |
| 9,905,679 B2 | 2/2018 | Magnee et al. | |
| 2010/0078756 A1* | 4/2010 | Schmidt | H01L 23/3171 257/499 |
| 2011/0062547 A1* | 3/2011 | Onishi | H01L 21/764 257/510 |
| 2013/0087828 A1* | 4/2013 | Koshimizu | H01L 21/82385 257/139 |

(Continued)

OTHER PUBLICATIONS

Appels, J.A., "High voltage thin layer devices (RESURF devices)", Philips Research Laboratories, IEDM, pp. 238-241, IEEE 1979.

(Continued)

*Primary Examiner* — Nathan W Ha

(57) ABSTRACT

A semiconductor device comprising a pn junction diode and a method of making the same. The device includes a semiconductor substrate having a first conductivity type. The device also includes a buried oxide layer located in the substrate. The device further includes a semiconductor region having a second conductivity type extending beneath the buried oxide layer to form a pn junction with a semiconductor region having the first conductivity type. The pn junction is located beneath the buried oxide layer and extends substantially orthogonally with respect to a major surface of the substrate. The device also includes a field plate electrode comprising a semiconductor region located above the buried oxide layer for modifying an electric field at the pn junction by application of a potential to the field plate electrode.

15 Claims, 2 Drawing Sheets

(56) References Cited

U.S. PATENT DOCUMENTS

| | | | |
|---|---|---|---|
| 2015/0115342 A1* | 4/2015 | Kaya | H01L 29/7816 |
| | | | 257/296 |
| 2015/0294898 A1* | 10/2015 | Yamaguchi | H01L 21/76224 |
| | | | 257/506 |
| 2018/0090479 A1* | 3/2018 | Weyers | H01L 27/0255 |
| 2018/0138120 A1* | 5/2018 | Ganitzer | H01L 21/4857 |
| 2018/0204935 A1* | 7/2018 | Kotani | H01L 29/866 |
| 2018/0331178 A1* | 11/2018 | Kotani | H01L 27/0255 |
| 2019/0172908 A1* | 6/2019 | Ikuta | H01L 29/0653 |
| 2019/0288062 A1* | 9/2019 | Takaoka | H01L 29/0634 |
| 2019/0288066 A1* | 9/2019 | Lee | H01L 29/402 |

OTHER PUBLICATIONS

Benoist, T., "Improved ESD Protection in Advanced FDSOI by Using Hybrid SOI/Bulk Co-integration", Conference Paper, IEEE Nov. 2010.

Dinh, T. V., "An SiGe heterojunction bipolar transistor with very high open-base breakdown voltage", BCTM, IEEE 2014.

Litty, A., "Optimization of a high-voltage MOSFET in ultra-thin 14nm FDSOI Technology", Proceedings of the 27th International Symposium on Power Semiconductor Devices & IC's, May 10-14, 2015.

* cited by examiner

SEMICONDUCTOR DEVICE COMPRISING A PN JUNCTION DIODE

BACKGROUND

The present specification relates to a semiconductor device comprising a pn junction diode and a method of making a semiconductor device comprising a pn junction diode.

In advanced fully-depleted silicon-on-insulator (FDSOI) technologies, while most of active devices (e.g. Metal Oxide Semiconductor Field Effect Transistors (MOSFETs)) are built on an SOI region where the insulator is a buried oxide layer, active devices with high current and high voltages (e.g. Laterally Diffused Metal Oxide Semiconductor Field Effect Transistors (LDMOS), PN junction diodes) are constructed on a non-SOI region (i.e. on a conventional bulk substrate, which may be called a HYBRID region, where the buried oxide layer has been removed). The reverse-bias junction breakdown voltage is one of the key Figure of Merit (FoM) for these devices.

FIG. 1 shows an example of a pn junction diode 10. The diode includes a semiconductor substrate 2, which may be a p-type substrate. An n-well 4 is located on the substrate 2. A p-type (P+) region 14 forms a first electrode (the cathode) of the diode 10. The other electrode (the anode) of the diode 10 is formed by n-type regions 12. The electrodes 12, 14 are separated by isolation regions 6.

In a device of the kind shown in FIG. 1, the pn junction is located at the interface between the underside of a p-type region 14 and the n-well 4. The point at which the highest electric field occurs in such a device (and therefore the point at which breakdown occurs—indicated at 20 in FIG. 1) is therefore located deep in the substrate (i.e. away from the silicon surface). In such a device the breakdown voltage is simply determined by the junction doping between the p-type region 14 and the n-well 4. This diode is a vertical device.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a semiconductor device comprising:
a semiconductor substrate having a first conductivity type;
a buried oxide layer located in the substrate;
a semiconductor region having a second conductivity type extending beneath the buried oxide layer to form a pn junction with a semiconductor region having the first conductivity type, wherein the pn junction is located beneath the buried oxide layer and extends substantially orthogonally with respect to a major surface of the substrate; and
a field plate electrode comprising a semiconductor region located above the buried oxide layer for modifying an electric field at the pn junction by application of a potential to the field plate electrode.

According to another aspect of the present disclosure, there is provided a method of making a semiconductor device comprising a pn junction diode, the method comprising:
providing a semiconductor substrate having a first conductivity type;
forming a buried oxide layer in the substrate;
forming a semiconductor region having a second conductivity type, wherein the semiconductor region having the second conductivity type extends beneath the buried oxide layer to form a pn junction with a semiconductor region having the first conductivity type, and wherein the pn junction is located beneath the buried oxide layer and extends substantially orthogonally with respect to a major surface of the substrate; and
forming a field plate electrode comprising a semiconductor region located above the buried oxide layer for modifying an electric field at the pn junction by application of a potential to the field plate electrode.

The arrangement of the pn junction located beneath the buried oxide layer and extending substantially orthogonally with respect to the major surface of the substrate can allow the breakdown voltage of the device to be increased substantially in comparison to known devices in which the pn junction is located deeper into the substrate (typically at the interface between the underside of a p-type region located in an n-well as shown in FIG. 1). Moreover, the proximity of the pn junction to the buried oxide layer can allow the breakdown voltage and/or leakage current of the device to be tuned by the application of a bias voltage to the field plate electrode. This diode is a lateral device.

The semiconductor region having the first conductivity type that forms the pn junction with the semiconductor region having the second conductivity type may include a doped semiconductor region that is more highly doped than the substrate and that is located immediately beneath the buried oxide layer. In this way, a pn junction diode between a highly doped region and the lower doped semiconductor region having the first conductivity type can be formed. The more highly doped region may be located immediately beneath the buried oxide layer so that the pn junction itself is located closer to the field plate electrode, for closer control of the breakdown voltage and/or leakage current of the device.

The device may include a semiconductor region having the first conductivity type located in the substrate immediately beneath the buried oxide layer and laterally spaced apart from the pn junction. This semiconductor region may be more highly doped than the substrate. This can increase performance by lowering the resistance of the device, in turn allowing a better trade-off between the on-state resistance and the breakdown voltage of the device.

A part of the semiconductor region having the second conductivity type extending beneath the buried oxide layer that is located immediately beneath the buried oxide layer may be more highly doped than a remainder of the semiconductor region having the second conductivity type extending beneath the buried oxide layer. The more highly doped region may be located immediately beneath the buried oxide layer so that the pn junction itself is located closer to the field plate electrode, for closer control of the breakdown voltage and/or leakage current of the device.

The semiconductor region forming the field plate electrode may have the second conductivity type.

The field plate electrode may extend over substantially all of the semiconductor region having the second conductivity type located beneath the buried oxide layer.

The field plate electrode may extend over the pn junction. Again, this can allow for closer control of the breakdown voltage and/or leakage current of the device.

A part of the semiconductor region having the second conductivity type extending beneath the buried oxide layer that is located immediately beneath the buried oxide layer may be more highly doped than a remainder of the semiconductor region having the second conductivity type extending beneath the buried oxide layer. The more highly doped region may be located immediately beneath the buried oxide layer so that the pn junction itself is located closer to the field plate electrode, for closer control of the breakdown voltage and/or leakage current of the device.

The semiconductor region forming the field plate electrode may have the first conductivity type.

The field plate electrode may extend over substantially all of the semiconductor region having the first conductivity type located beneath the buried oxide layer.

The field plate electrode may extend over the pn junction. Again, this can allow for closer control of the breakdown voltage and/or leakage current of the device.

The device may include a first electrode comprising a semiconductor region having the first conductivity type located in the semiconductor region having the first conductivity type that forms the pn junction. The device may also include a second electrode comprising a semiconductor region having the second conductivity type located in the semiconductor region having the second conductivity type.

The first electrode and the second electrode may each be separated from each other by one or more isolation regions.

In some embodiments, the semiconductor substrate may be a fully depleted silicon on insulator (FDSOI) substrate. In such embodiments, the buried oxide layer may be the insulating layer of the FDSOI substrate.

According to a further aspect of the present disclosure, there is provided an ESD protection device comprising a semiconductor device of the kind set out above.

According to another aspect of the present disclosure, there is provided a switch for a power management circuit comprising a semiconductor device of the kind set out above.

According to a further aspect of the present disclosure, there is provided a switch for an RF front end circuit comprising a semiconductor device of the kind set out above.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 1:
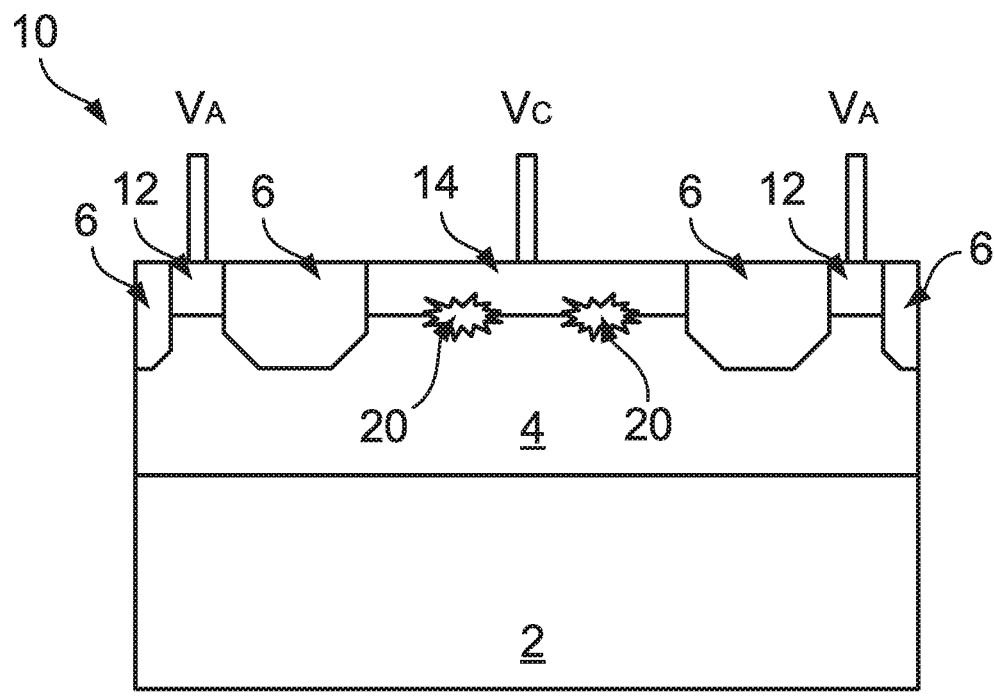
FIG. 1 shows an example of a semiconductor device comprising a pn junction diode.
Figure 2:
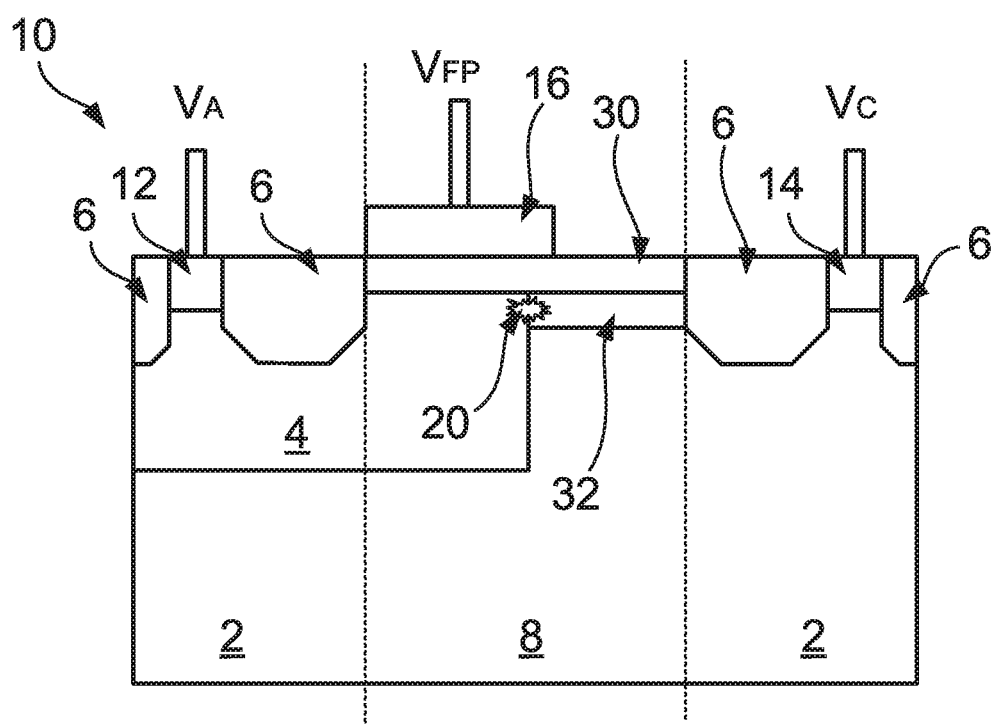
FIG. 2 shows a semiconductor device comprising a pn junction diode according to an embodiment of the present disclosure.

FIG. 2 shows a semiconductor device 10 comprising a pn junction diode according to an embodiment of the present disclosure.

The device 10 includes a semiconductor substrate, which may comprise silicon. In some embodiments, the substrate may be a silicon on insulator (SOI) substrate and in particular may be a fully depleted silicon on insulator (FDSOI) substrate.

As shown in FIG. 2, the substrate in this example can include a first region 8, upon which is located a buried oxide layer 30. In embodiments in which the substrate comprises an SOI (e.g. FDSOI) substrate, the buried oxide layer 30 may be formed by the insulating layer of the SOI/FDSOI substrate. A field plate electrode of the device can be formed on top of the buried oxide layer 30, as will be described in more detail below. The substrate can also include regions 2, which do not lay beneath the buried oxide layer 30. In embodiments in which the substrate comprises an SOI (e.g. FDSOI) substrate, the regions 2 may comprise so called hybrid regions of the SOI/FDSOI substrate, in which the insulating layer of the SOI/FDSOI is not present.

The substrate (including the regions 2, 8) has a first conductivity type. In the present embodiment, the first conductivity type is p-type conductivity, although it is envisaged that in other embodiments the first conductivity type may be n-type conductivity.

The device 10 also includes a semiconductor region 4 that extends beneath the buried oxide layer 30. The semiconductor region 4 has a second conductivity type, which is a different conductivity type to the first conductivity type. In the present embodiment, the second conductivity type is n-type conductivity, although it is envisaged that in other embodiments the second conductivity type may be p-type conductivity.

The semiconductor region 4 forms a pn junction with the semiconductor region 8 having the first conductivity type. The pn junction extends substantially orthogonally with respect to a major surface of the substrate. The pn junction is located beneath the buried oxide layer 30.

The device 10 further includes a field plate electrode 16. The field plate electrode 16 in this embodiment has the second conductivity type. The field plate electrode 16 extends above the semiconductor region 4 having the second conductivity type and in this embodiment also extends over the part of the first region 8 that forms the pn junction between the semiconductor region 4 and the first region 8. Accordingly, the pn junction is located directly beneath the field plate electrode 16. The proximity of the pn junction to the buried oxide layer 30 can allow the electric field at the pn junction to be modified, for tuning the breakdown voltage and/or leakage current of the device by the application of a bias voltage (VFP) to the field plate electrode 16. In some examples, the field plate 16 can be connected to ground, biased positive or negative, statically or dynamically depending on the application requirements (e.g. depending on whether a higher breakdown voltage, or lower on-state resistance ($R_{on}$) is to be prioritised, or a combination of both).

In the present embodiment, the semiconductor region 8 is provided with a region 32, which has the first conductivity type and that is more highly doped than the remainder of the substrate (e.g. the region 8). The highly doped region 32 may, in some embodiments be provided as part of a layer (e.g. ground plane) that is typically available in a number of FDSOI technologies. By making use of this layer, the device 10 may be constructed without having to make special provision for the highly doped region 32 (e.g. without additional implants or the associated costs).

In this embodiment, the region 32 forms the pn junction with the semiconductor region 4. The region 32 is located immediately beneath the buried oxide layer 30. In this way, the location 20 at which breakdown can occur is positioned close to the field plate electrode 16, for close control of breakdown voltage and/or leakage current of the device by the application of a bias voltage to the field plate electrode 16.

The device also includes a first electrode 14 that comprises a semiconductor region having the first conductivity type. The first electrode 14 is located in semiconductor substrate (in particular, in the region 2). The first electrode 14 in this embodiment forms a cathode of the device 10. The first electrode 14 may be more highly doped that the remainder of the substrate (e.g. the region 2).

The device also includes a second electrode 12 that comprises a semiconductor region having the second conductivity type. The second electrode 12 is located in the semiconductor region 4 having the second conductivity type and in this embodiment forms an anode of the device 10. The second electrode 12 may be more highly doped that the remainder of the semiconductor region 4.

In the present embodiment, the second electrode 12 and the first electrode 14 are each separated from each other by isolation region(s) 6.

Figure 3:
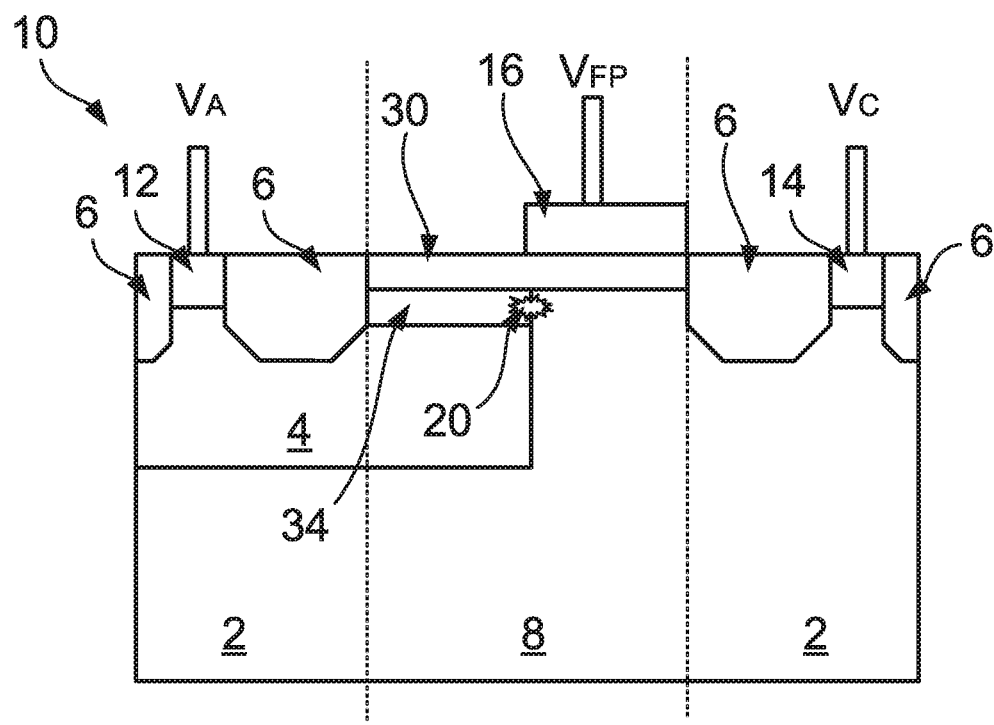
FIG. 3 shows a semiconductor device comprising a pn junction diode according to another embodiment of the present disclosure.

FIG. 3 shows a semiconductor device 10 comprising a pn junction diode according to another embodiment of the present disclosure. The device 10 in FIG. 3 is similar in some respects to the device 10 described above in relation to FIG. 2, and only the differences will be described below in detail.

In the present embodiment, the semiconductor region 4 is provided with a region 34, which has the second conductivity type and that is more highly doped than the remainder of the semiconductor region 4. The highly doped region 34 may, in some embodiments be provided as part of a layer (e.g. ground plane) that is typically available in a number of FDSOI technologies. By making use of this layer, the device 10 may be constructed without having to make special provision for the highly doped region 34 (e.g. without additional implants or the associated costs).

In this embodiment, the region 34 forms the pn junction with the semiconductor region 8. The region 34 is located immediately beneath the buried oxide layer 30. In this way, the location 20 at which breakdown can occur is positioned close to the field plate electrode 16, for close control of breakdown voltage and/or leakage current of the device by the application of a bias voltage (Vip) to the field plate electrode 16. This embodiment does not (necessarily) include a region 32 of the kind described above in relation to FIG. 2.

In the present embodiment, the field plate electrode 16 has the first conductivity type (p-type in this embodiment). Also, in contrast to the embodiment of FIG. 2, the field plate electrode 16 extends over substantially all of the semiconductor region 8 having the first conductivity type that is located beneath the buried oxide layer 30. The field plate electrode 16 may also extend over the pn junction and optionally also over part of the region 4. Accordingly, the pn junction is located directly beneath the field plate electrode 16. The proximity of the pn junction to the buried oxide layer 30 can allow the electric field at the pn junction to be modified, for tuning the breakdown voltage and/or leakage current of the device by the application of a bias voltage ($V_{FP}$) to the field plate electrode 16. Again, In some examples, the field plate 16 can be connected to ground, biased positive or negative, statically or dynamically depending on the application requirements (e.g. depending on whether a higher breakdown voltage, or lower on-state resistance ($R_{on}$) is to be prioritised, or a combination of both).

Figure 4:
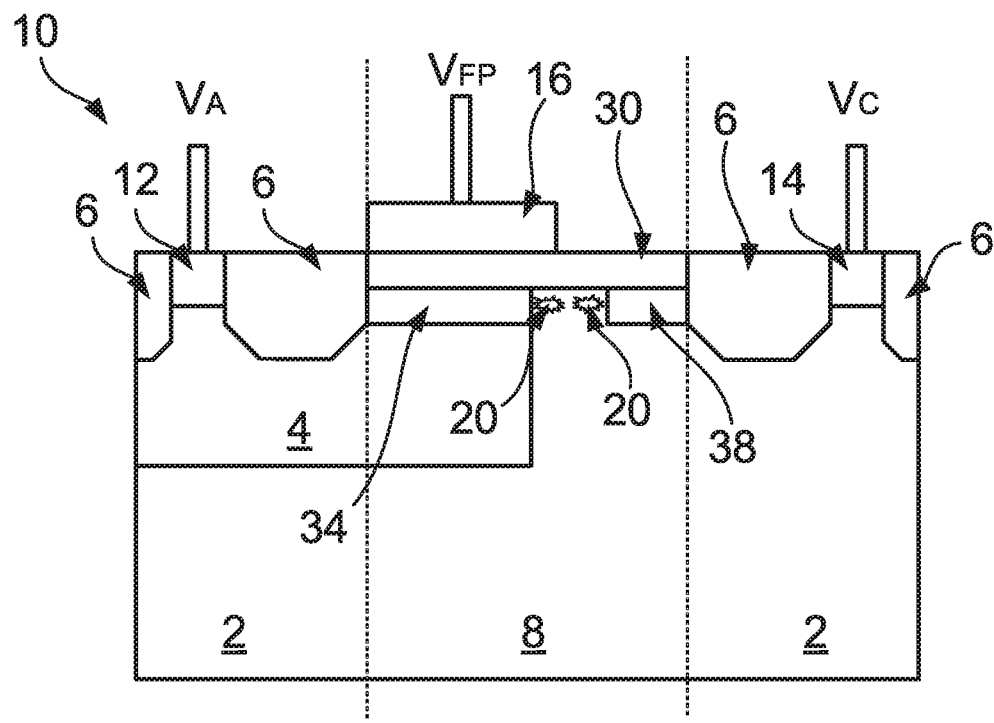
FIG. 4 shows a semiconductor device comprising a pn junction diode according to a further embodiment of the present disclosure.

FIG. 4 shows a semiconductor device 10 comprising a pn junction diode according to a further embodiment of the present disclosure. The device 10 in FIG. 4 is similar in some respects to the device 10 described above in relation to FIG. 3, and only the differences will be described below in detail.

The field plate electrode 16 in this embodiment has the second conductivity type. The field plate electrode 16 extends above the semiconductor region 4 having the second conductivity type and in this embodiment also extends over the part of the first region 8 that forms the pn junction between the semiconductor region 4 and the first region 8. Accordingly, the pn junction is located directly beneath the field plate electrode 16. The proximity of the pn junction to the buried oxide layer 30 can allow the electric field at the pn junction to be modified, for tuning the breakdown voltage and/or leakage current of the device by the application of a bias voltage ($V_{FP}$) to the field plate electrode 16. Once again, in some examples, the field plate 16 can be connected to ground, biased positive or negative, statically or dynamically depending on the application requirements (e.g. depending on whether a higher breakdown voltage, or lower on-state resistance ($R_{on}$) is to be prioritised, or a combination of both).

In this embodiment, the device 10 includes a semiconductor region 38 having the first conductivity type that is located in the region 8 of the substrate immediately beneath the buried oxide layer 30. The semiconductor region 38 may be more highly doped than the remainder of the substrate (e.g. the region 8). The semiconductor region 38 is laterally spaced apart from the pn junction formed between the region 34 and the region 8. The inclusion of the semiconductor region 38 may increase performance by lowering the resistance of the device 10, in turn allowing a better trade off between the on-state resistance and the breakdown voltage of the device 10.

A semiconductor device 10 of the kind described herein may be provided in a ESD protection device. A semiconductor device 10 of the kind described herein may be provided in a switch for a power management circuit. A semiconductor device 10 of the kind described herein may be provided in a switch for an RF front end circuit.

A method of making a semiconductor device 10 comprising a pn junction diode of the kind described herein may include providing a semiconductor substrate having the first conductivity type. The method may also include forming (e.g. depositing) a buried oxide layer 30 in the substrate. The method may further include forming the semiconductor region 4 having the second conductivity type, in which the semiconductor region 4 having the second conductivity type extends beneath the buried oxide layer 30 to form a pn junction with a semiconductor region 8 of the substrate having the first conductivity type. The pn junction is located beneath the buried oxide layer 30 and extends substantially orthogonally with respect to a major surface of the substrate. The method may also include forming (e.g. depositing and patterning) the field plate electrode 16 comprising a semiconductor region located above the buried oxide layer 30 for modifying an electric field at the pn junction by application of a potential to the field plate electrode 16.

Accordingly, there has been described a semiconductor device comprising a pn junction diode and a method of making the same. The device includes a semiconductor substrate having a first conductivity type. The device also includes a buried oxide layer located in the substrate. The device further includes a semiconductor region having a second conductivity type extending beneath the buried oxide layer to form a pn junction with a semiconductor region having the first conductivity type. The pn junction is located beneath the buried oxide layer and extends substantially orthogonally with respect to a major surface of the substrate. The device also includes a field plate electrode comprising a semiconductor region located above the buried oxide layer for modifying an electric field at the pn junction by application of a potential to the field plate electrode.

Although particular embodiments of this disclosure have been described, it will be appreciated that many modifications/additions and/or substitutions may be made within the scope of the claims.

The invention claimed is:

1. A semiconductor device comprising:
a semiconductor substrate having a first conductivity type;
a buried oxide layer located in the substrate;
a semiconductor region having a second conductivity type extending beneath the buried oxide layer to form a pn junction with a semiconductor region having the first conductivity type, wherein the pn junction extends substantially orthogonally with respect to a major surface of the substrate and is located beneath the buried oxide layer in a line substantially orthogonally with respect to the major surface of the substrate; and
a field plate electrode comprising a second semiconductor region located above the buried oxide layer for modifying an electric field at the pn junction by application of a potential to the field plate electrode, the second semiconductor region is located over the buried oxide layer in a line substantially orthogonally with respect to the major surface of the substrate.

2. The semiconductor device of claim 1, wherein the semiconductor region having the first conductivity type that forms the pn junction with the semiconductor region having the second conductivity type comprises a doped semiconductor region that is more highly doped than the substrate and that is located immediately beneath the buried oxide layer.

3. The semiconductor device of claim 1, comprising a third semiconductor region having the first conductivity type located in the substrate immediately beneath the buried oxide layer and laterally spaced apart from the pn junction, wherein the third semiconductor region is more highly doped than the substrate.

4. The semiconductor device of claim 3, wherein a part of the semiconductor region having the second conductivity type extending beneath the buried oxide layer that is located immediately beneath the buried oxide layer is more highly doped than a remainder of said semiconductor region having the second conductivity type extending beneath the buried oxide layer.

5. The semiconductor device of claim 2, wherein the second semiconductor region forming the field plate electrode has the second conductivity type.

6. The semiconductor device of claim 5, wherein the field plate electrode extends over substantially all of the semiconductor region having the second conductivity type located beneath the buried oxide layer.

7. The semiconductor device of claim 5, wherein the field plate electrode extends over the pn junction.

8. The semiconductor device of claim 1, wherein a part of the semiconductor region having the second conductivity type extending beneath the buried oxide layer that is located immediately beneath the buried oxide layer is more highly doped than a remainder of said semiconductor region having the second conductivity type extending beneath the buried oxide layer.

9. The semiconductor device of claim 8, wherein the second semiconductor region forming the field plate electrode has the first conductivity type.

10. The semiconductor device of claim 9, wherein the field plate electrode extends over substantially all of the semiconductor region having the first conductivity type located beneath the buried oxide layer.

11. The semiconductor device of claim 9, wherein the field plate electrode extends over the pn junction.

12. The semiconductor device of claim 1 comprising:
a first electrode comprising a fourth semiconductor region having the first conductivity type located in the semiconductor region having the first conductivity type that forms the pn junction; and
a second electrode comprising a fifth semiconductor region having the second conductivity type located in the semiconductor region having the second conductivity type.

13. The semiconductor device of claim 1, wherein the semiconductor substrate comprises a fully depleted silicon on insulator (FDSOI) substrate, and wherein the buried oxide layer comprises the insulating layer of said FDSOI substrate.

14. An ESD protection device, a switch for a power management circuit or a switch for an RF front end circuit comprising the semiconductor device of claim 1.

15. The semiconductor device of claim 1, wherein the field plate electrode is located over the pn junction in a line substantially orthogonally with respect to the major surface of the substrate.

* * * * *